(12) United States Patent
Sevier et al.

(10) Patent No.: US 6,359,836 B1
(45) Date of Patent: Mar. 19, 2002

(54) LOCKING ISOLATION MOUNTING SYSTEM FOR DATA STORAGE MODULES

(75) Inventors: Richard G. Sevier; Mike Strickler, both of Boise, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/328,932

(22) Filed: Jun. 9, 1999

(51) Int. Cl.[7] .................................................. H05K 7/14
(52) U.S. Cl. ........................ 367/725; 361/728; 361/729; 361/732; 361/685; 174/50; 174/52.1; 312/223.1; 312/223.2; 248/73; 248/560; 248/562
(58) Field of Search .............................. 361/725, 728, 361/683, 684, 685, 729, 732, 730, 747, 724–726; 174/52.1, 50; 312/223.1, 223.2, 223.6; 248/73, 560, 562

(56) References Cited

U.S. PATENT DOCUMENTS

| | | | | |
|---|---|---|---|---|
| 4,937,806 A | * | 6/1990 | Babson et al. ............. | 369/75.1 |
| 5,277,615 A | * | 1/1994 | Hastings et al. ............ | 439/377 |
| 5,575,529 A | * | 11/1996 | Dowdy et al. ............ | 312/223.2 |
| 5,668,697 A | * | 9/1997 | Dowdy ....................... | 361/685 |
| 5,765,933 A | * | 6/1998 | Paul et al. ................ | 312/332.1 |
| 6,028,766 A | * | 2/2000 | Strickler ..................... | 361/685 |
| 6,052,278 A | * | 4/2000 | Tanzer et al. ............... | 361/685 |
| 6,160,703 A | * | 12/2000 | Lopez ......................... | 361/685 |
| 6,166,901 A | * | 12/2000 | Gamble et al. ............. | 361/685 |
| 6,209,842 B1 | * | 4/2001 | Anderson et al. ........... | 248/560 |

* cited by examiner

*Primary Examiner*—Leo P. Picard
*Assistant Examiner*—David Foster

(57) ABSTRACT

An isolation mounting system for disk drive and other storage modules in which the operating unit (e.g., a disk drive) is locked more firmly into its operating position. During shipping and installation the lock is disengaged to allow full use of the elastomeric or other shock mounting system. Thus, the storage module of the present invention simulates a hard mount system during operation and a soft mount system during shipping and handling. A data storage module constructed according to one embodiment of the invention includes a data storage device, typically a disk drive, shock mounted in a housing and a lock selectively engagable between the data storage device and the housing. The lock is operable between a first disengaged position in which the lock does not restrict movement of the data storage device within the housing and a second engaged position in which the lock restricts substantially all movement of the data storage device within the housing. In one preferred version of this embodiment, the lock consists of wedges inserted at each shock mount to effectively remove the bulk of the characteristic compliance.

11 Claims, 6 Drawing Sheets

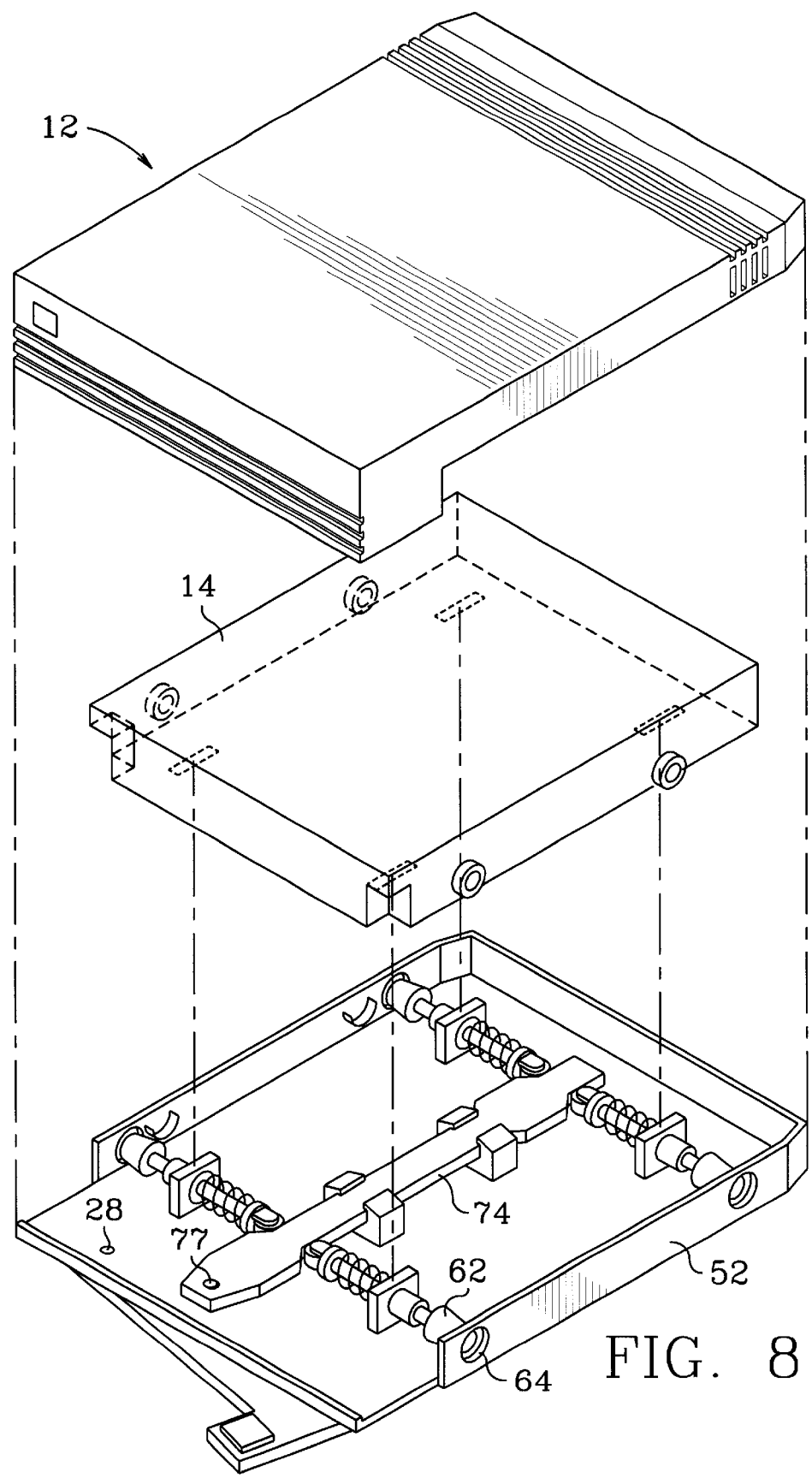

LOCKING ISOLATION MOUNTING SYSTEM FOR DATA STORAGE MODULES

FIELD OF THE INVENTION

The invention relates generally to an isolation mounting system for data storage modules and, more particularly, to a mounting system that includes a lock to hold the module firmly in place in its final/operational position.

BACKGROUND OF THE INVENTION

Redundant arrays of inexpensive or independent data storage devices (RAID) are being employed by the mass storage industry to provide variable capacity data storage. RAID systems use interconnected disk drives to achieve the desired capacity of mass storage. With this approach, a disk drive of one capacity may be manufactured and packaged with the same or different capacity drives to provide the required storage capacity. RAID systems eliminate the need to manufacture disk drives individually designed to meet specific storage requirements. Each disk drive in a RAID system is usually housed in an individual module. The modules are handled manually for shipping, installation and the like. The modules slide into and out of an enclosure or rack that houses the array of disk drives and provides the sockets, plug-ins and other connections for the electrical interconnection of the drives. Controllers orchestrate the interconnection and control access to selected disk drives for data reading and writing operations.

Disk drives are high precision electro-mechanical devices in which the read/write transducer heads fly on an air bearing at the surface of the disks. The flight height of the head is only a few micro-inches from the disk surface. This and other sensitive aspects of the disk drives make them vulnerable to damage during shipping and handling. Consequently, some type of shock mounting system is often used to isolate the disk drive from the module. Typically, compliant members such as elastomeric disks or doughnuts are interposed between the disk drive and the module housing to isolate the disk drive from its housing. One such isolation system is described in U.S. Pat. No. 5,668,697 titled Data Storage Module Having Cradles On Housing And Elastomeric Member Mounted On Data Storage Mechanism. The compliant members attenuate external shock and vibration inputs to the disk drive. During operation of the disk drive, however, the compliant members can introduce self-excited rotational modes of the disk drive mechanism. That is, the same cushioning characteristics of the compliant members that attenuate external shock and vibration introduce a degree of freedom of movement that allows the disk drive to react to its own actuator movement. Self-excitement can be a significant problem when torque is applied to the actuator during seeking operations. The actuator torque creates a reaction torque that tends to rotate the disk drive in a direction opposite the direction of the actuator torque. Rotating the disk drive can cause off track errors of the actuator, particularly with increasing track densities, which leads to errors reading data from the disks and writing data to the disks.

SUMMARY OF THE INVENTION

Accordingly, the present invention is directed to an isolation mounting system for disk drive and other storage modules in which the operating unit (e.g., a disk drive) is locked more firmly into its operating position. During shipping and installation the lock is disengaged to allow full use of the elastomeric or other shock mounting system. Thus, the present invention simulates a stiff mount system during operation and a soft mount system during shipping and handling. A data storage module constructed according to one embodiment of the invention includes a data storage device, typically a disk drive, shock mounted in a housing and a lock selectively engagable between the data storage device and the housing. The lock is operable between a first disengaged position in which the lock does not restrict movement of the data storage device within the housing and a second engaged position in which the lock restricts substantially all movement of the data storage device within the housing. In one preferred version of this embodiment, the lock consists of wedges inserted at each shock mount to effectively remove the bulk of the characteristic compliance. This wedge locking system, which will tend to raise the resonant frequencies in all modes, should reduce the amount of self-excitement in the rotational mode during actuator seeking.

In a second embodiment of the invention, the data storage module includes lock blocks connected to the data storage device. The lock blocks are movable between a first disengaged position in which the blocks do not restrict movement of the data storage device within the housing and a second engaged position in which each block extends through an opening in the side of the housing to restrict substantially all movement of the data storage device within the housing. In one preferred version of this embodiment, a camming device connecting the lock blocks and the data storage device is used to move the blocks from the unlocked position to the locked position, or from the locked position to the second position.

Unless expressly and clearly stated otherwise, "a" something in this Specification and in the Claims means one or more of that something. For example, "a lock" in claim 1 means one or more locks and "a wedge" in claim 2 means one or more wedges.

DESCRIPTION OF THE DRAWINGS

FIG. 8 is an exploded isometric view of a disk drive module constructed according to a second embodiment of the invention in which locking wedges are engaged using a camming device.

In FIG. 11, the wedges are in the disengaged position.

In FIG. 12, the wedges are in the engaged position.

Like parts are referred to by like reference numbers in all Figures.

DETAILED DESCRIPTION OF THE INVENTION

Figure 1:
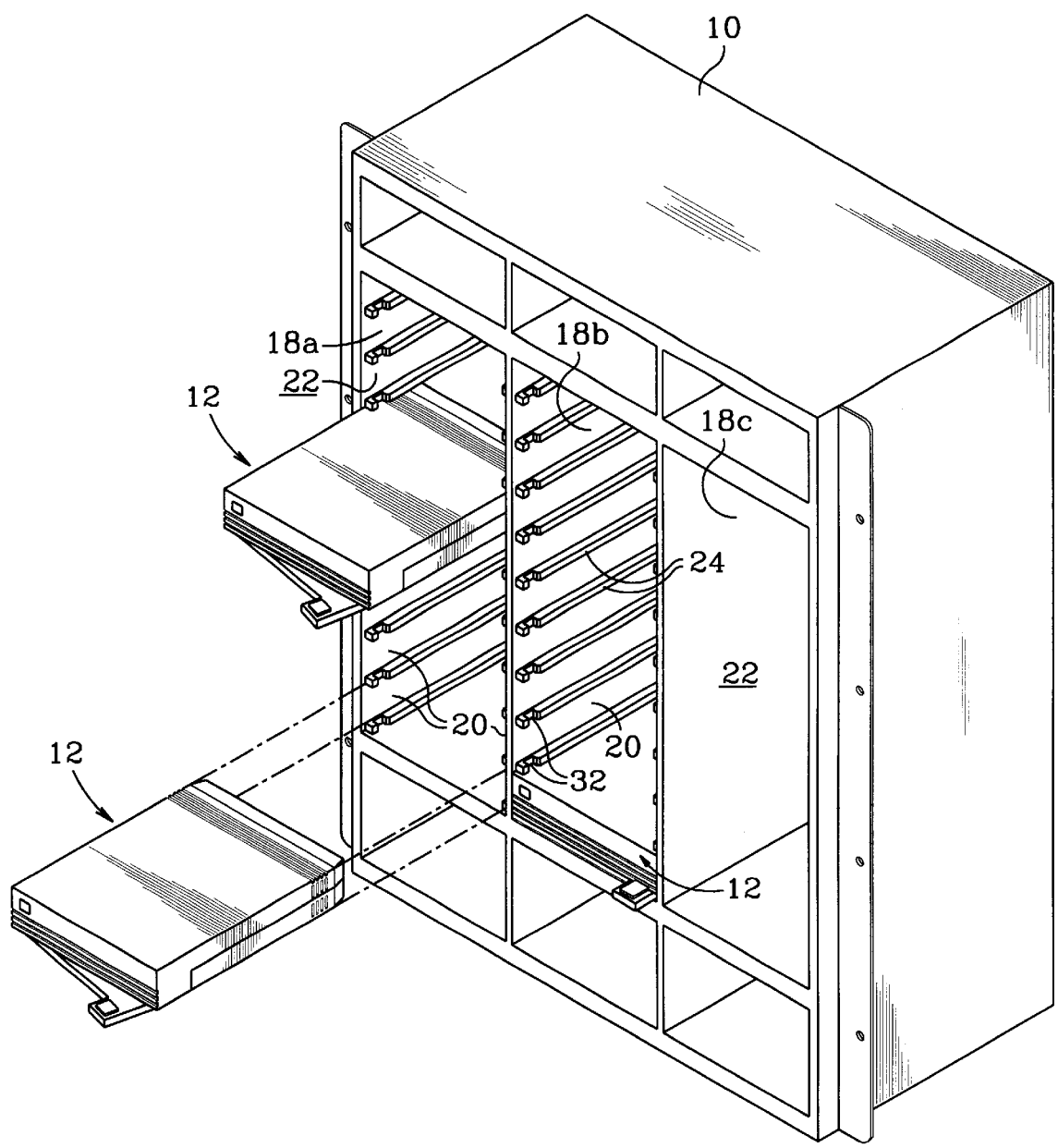
FIG. 1 is an isometric view of an enclosure that houses an array of disk drive modules.

FIG. 1 is an isometric view of an enclosure 10 for a redundant array of independent devices (RAID). Enclosure 10 houses an array of storage modules 12. Each module 12 includes a disk drive or other data storage device 14 (shown in FIG. 2) mounted in a rectangular housing 16. Disk drives 14 are connected into the electrical network of the RAID system by, for example, multiple pin connectors (not shown) at the rear of each module 12. Enclosure 10 is partitioned into three bays 18a, 18b and 18c. Bays 18a and 18b house the storage modules 12. The third bay 18c typically houses a controller and other operational equipment (not shown). Modules 12 slide into a series of slots 20 constructed along the inside walls 22 of enclosure 10. Slots 20 are defined by a series of rails 24 that protrude from interior sidewalls 20 of enclosure 10.

Figure 2:
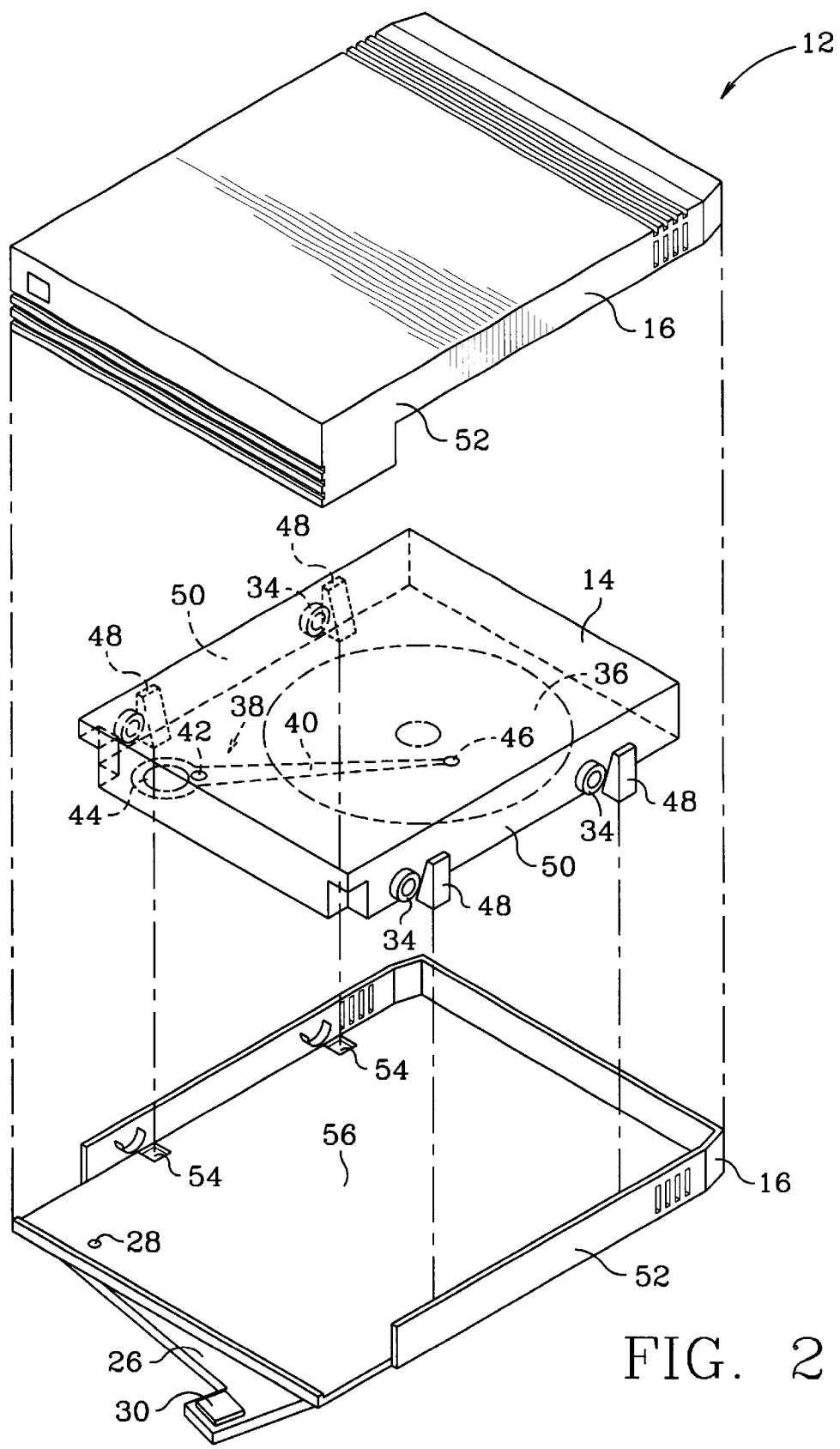
FIG. 2 is an exploded isometric view of a disk drive module constructed according to one embodiment of the invention in which locking wedges are inserted manually through the bottom of the module housing near each rubber shock mount.
Figure 4:
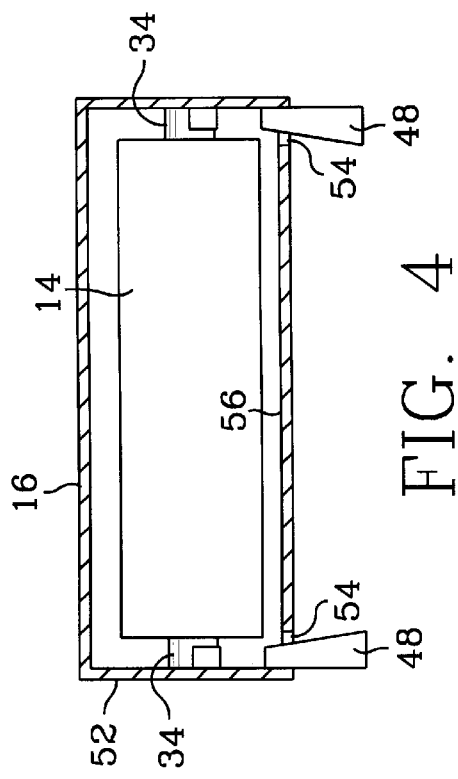
FIGS. 4 and 5 are cut-away end views of the module of FIG. 2 showing the locking wedges in the disengaged and engaged positions, respectively.
Figure 5:
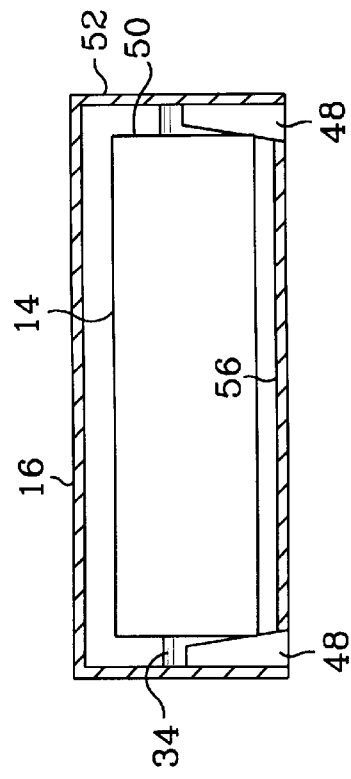
Figure 3:
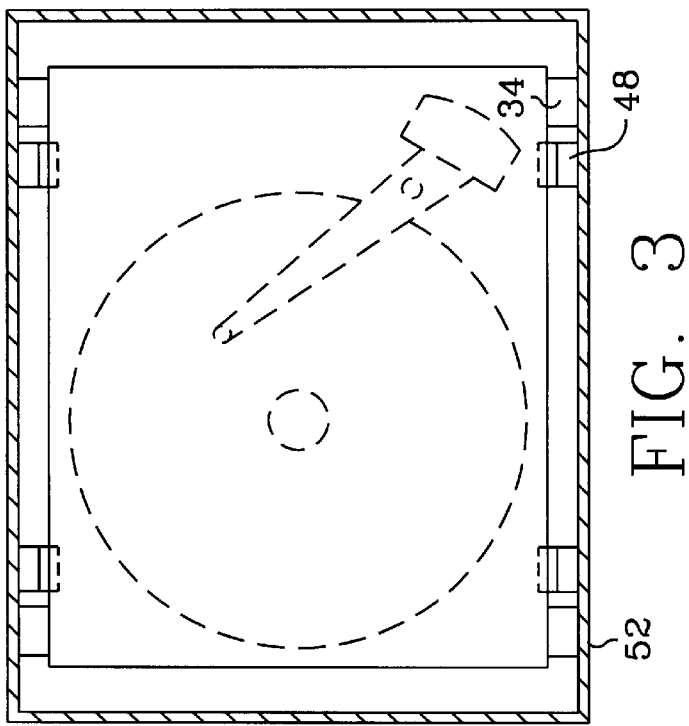
FIG. 3 is a top down plan view of the module of FIG. 2 showing the position of the locking wedges near each rubber shock mount.

Referring now also to FIG. 2, the installation and removal of modules 12 may be aided by an optional flat latch lever arm 26 which is pivotally mounted by a pivot 28. Latch lever arm 26 is mounted in a recess in the bottom front of each module 12. The latch lever includes a handle 30 at one end and a latch (not shown) at the other end. The latch is designed to engage a catch 32 at the front end of the rail 24 adjacent to each module 12. Leverage provided by pushing on handle 30 of latch lever arm 26 rotates latch lever arm 26 about pivot 28 and about catch 32 to push module 12 into the fully inserted position. During removal, pulling on handle 30 pulls module 12 from its full inserted position to separate connector parts after which module 12 slides easily in and out of slots 20. Further details of one such latch arrangement are described in U.S. Pat. No. 5,575,529 issued to Hewlett-Packard Co. on Nov. 19, 1996, entitled Module Enclosure And Module Latch Mechanism.

Referring to FIGS. 2–5, disk drive 14 is mounted within housing 16 on four elastomeric shock bushings 34. Shock bushings 34 are soft rubber doughnuts arranged as longitudinally spaced pairs on opposite sides of housing 16. Elastomeric bushings 34 cushion the disk drive by absorbing shock energy when the module is bumped or dropped. Further details of one such shock mounting system are described in U.S. Pat. No. 5,668,697 issued to Hewlett-Packard Co. on Sep. 16, 1997, entitled Data Storage Module Having Cradles On Housing And Elastomeric Member Mounted On Data Storage Mechanism. Disk drive 14 includes one or more disks 36 and an actuator 38. Actuator 38 includes an arm 40 that rotates about an axis 42 under the influence of a small motor 44. One or more transducer heads 46 positioned near the end of actuator arm 40 scan the surface of the adjacent disk 36 to record data on and read data from disk 36.

The same cushioning characteristics of the elastomeric bushings that attenuate external shock and vibration introduce a degree of freedom of movement that allows the disk drive to react to its own actuator movement. The actuator torque creates a reaction torque that tends to rotate the disk drive in a direction opposite the direction of the actuator torque. Rotating the disk drive can cause off track errors of the actuator which leads to errors reading data from the disks and writing data to the disks. In an effort to reduce rotation caused by this reaction torque, wedges 48 are inserted between sidewalls 50 of disk drive 14 and sidewalls 52 of module housing 16 to lock disk drive 14 more firmly into its operating position. Locking wedges 48 are shown in the inserted/engaged position in FIGS. 2, 3 and 5 and in the withdrawn/disengaged position in FIG. 4.

Figure 7:
FIG. 7 is a partial section top down plan view of the module housing showing the T shaped keeper.
Figure 6:
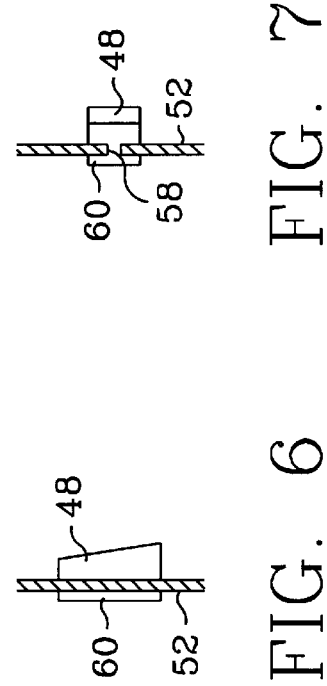
FIG. 6 is a partial section side view of the module housing showing the T shaped keeper.

In the embodiment shown in FIGS. 2–5, wedges 48 are manually inserted through holes 54 in the bottom 56 of module housing 16. Of course, it may be desirable to attach the wedges to the housing in some way to facilitate engagement and to avoid the need to keep track of loose wedges. For example, as shown in FIGS. 6 and 7, wedges 48 could be mounted in a slot 58 in sidewall 52 of housing 16 and held in place with a T shaped keeper 60. Wedges 48 may be made of a hard material to rigidly lock disk drive 14 into its operating position. Alternatively, wedges 48 may be made of a somewhat pliable material to firmly lock disk drive 14 into its operating position. The degree of pliability of wedges 48 and the corresponding rigidity of the operating position of disk drive 14 should be selected to reduce or eliminate the freedom of movement that allows the disk drive to react to its own actuator movement.

Figure 9:
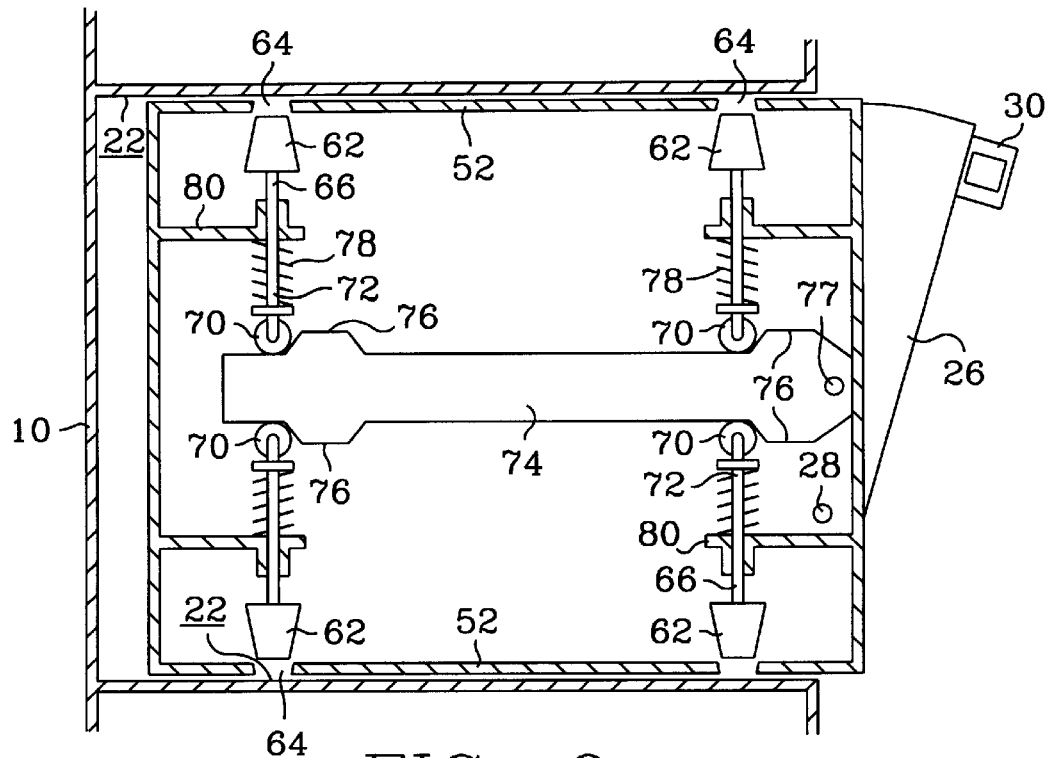
FIGS. 9 and 10 are top down plan views of the module of FIG. 8 in the disengaged and engaged positions, respectively, showing the cam plate and camming action of the locking blocks.
Figure 10:
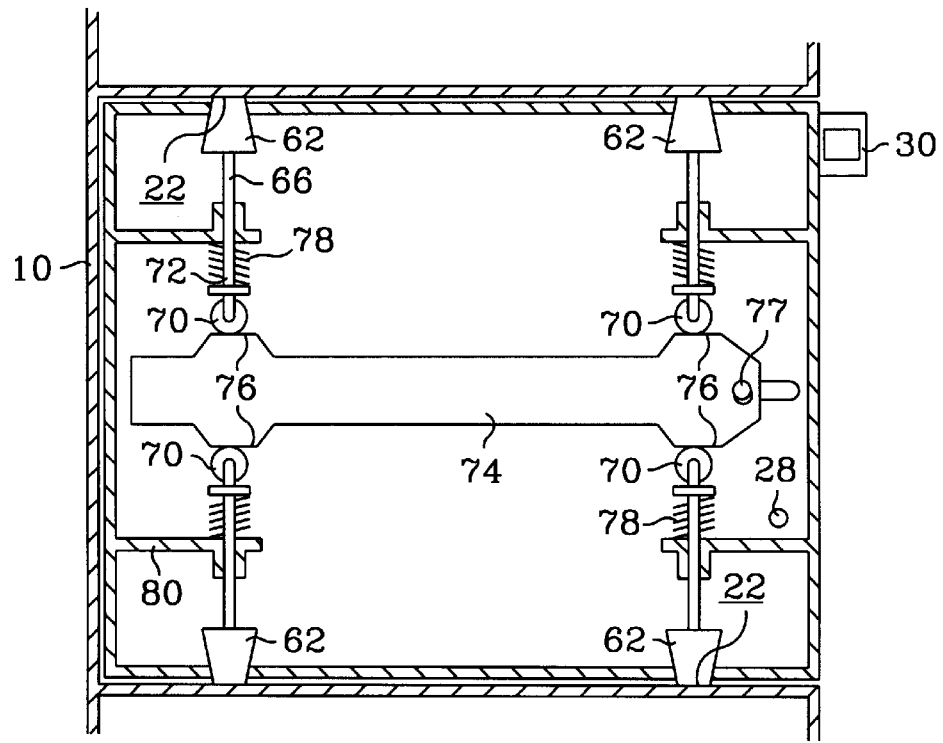
Figure 11:
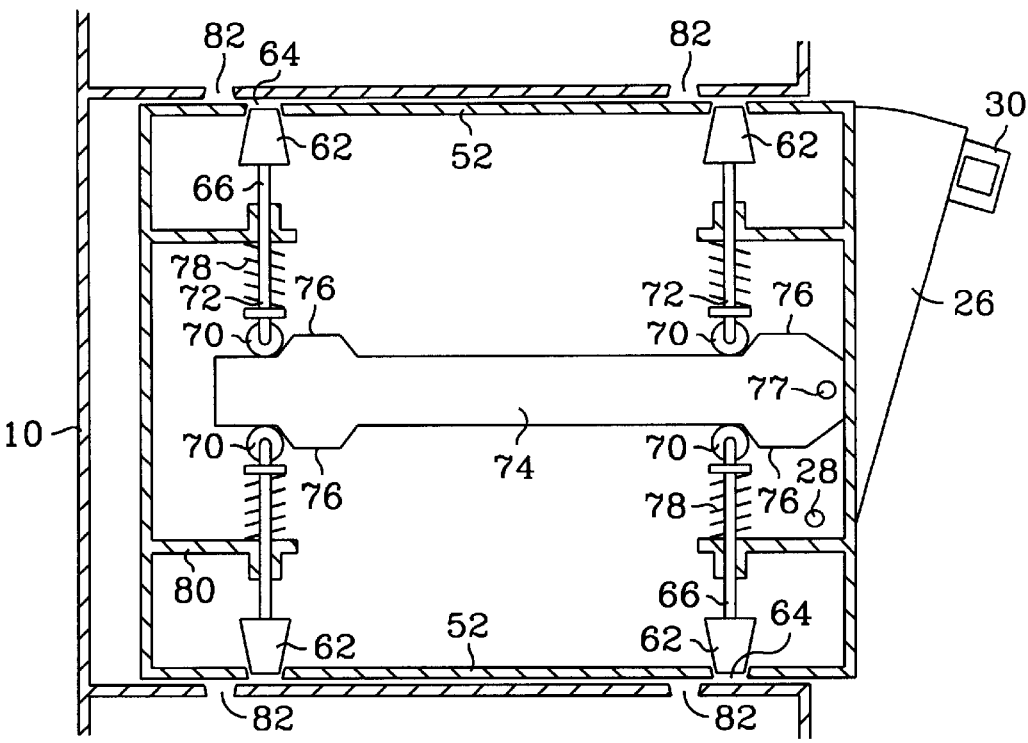
FIGS. 11 and 12 are top down plan views of a module constructed according to a third embodiment of the invention in which locking wedges extend through the module housing into openings in the enclosure to lock the disk drive into position.
Figure 12:
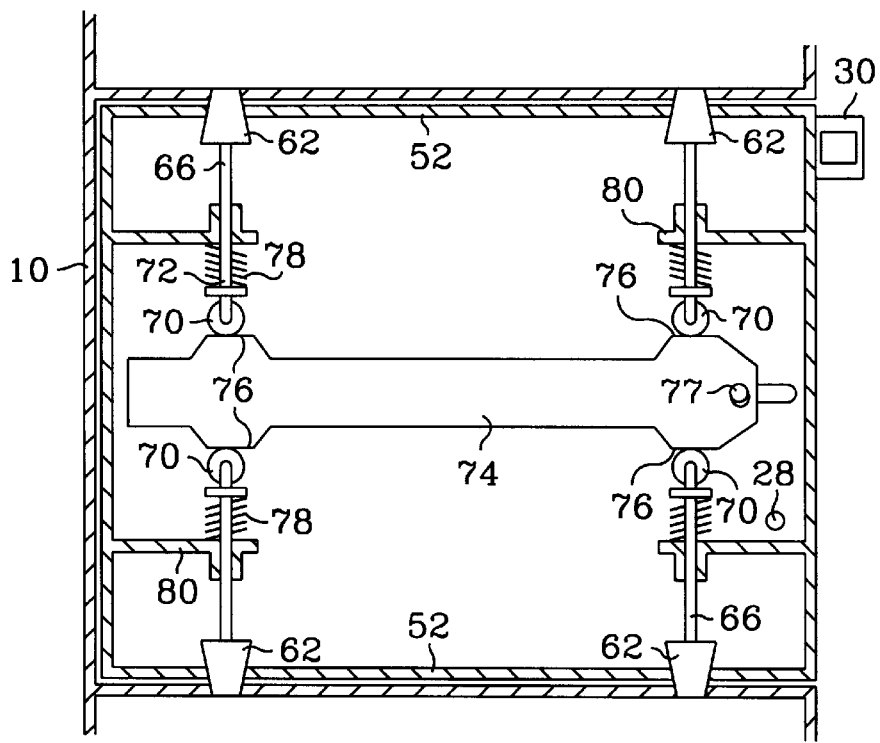

In a second embodiment of the invention illustrated in FIGS. 8–10, cam activated locking blocks 62 are used to secure disk drive 14 into the operating position. When blocks 62 are moved to the engaged position, shown in FIG. 10, they extend through openings 64 in sidewalls 52 of module housing 16. Preferably, blocks 62 extend out to abut enclosure sidewalls 22 in the fully engaged position to further stabilize disk drive 14 in the operating position. In an alternative embodiment illustrated in FIGS. 11 and 12, lock blocks 62 extend out through openings 82 in the sidewalls 22 of enclosure 10. Blocks 62 are mounted at the outer ends 66 of cam following arms 68. Cam followers 70 are mounted for rotation on the inner ends 72 of arms 68. A cam plate 74 is mounted to the bottom of disk drive 14. Cam plate 74 extends along the length of disk drive 14 from front to rear. Cam lobes 76 project out from the sides of cam plate 74 at locations that correspond generally to the location of shock bushings 34 when blocks 62 are in the engaged/locked position. Return springs 78 are positioned between blocks 62 and a support boss 80 formed on the inside of housing 16. Return springs 78 are configured to bias lock blocks 62 toward the disengaged position.

Cam plate 74 is attached to latch lever arm at pivot 77. As best seen by comparing FIGS. 9 and 10, cam plate 74 moves in and out at the urging of latch lever arm 26. Consequently, as lever arm 26 is moved in as described above during insertion of modules 12 in enclosure 10, lock blocks 62 are simultaneously moved out to the engaged position of FIG. 10 through the camming action of lobes 76 and followers 68. As lever arm 26 is moved out as described above during removal of modules 12 from enclosure 10, lock blocks 62 are simultaneously withdrawn to the disengaged position at the urging of return springs 78. Although it is expected that wedge shaped lock blocks 62 will help provide the desired rigidity, wedge shaped blocks are not critical in this embodiment of the invention. Other shapes may also be adequate to provide the required or desired rigidity.

Although the invention has been shown and described with reference to the foregoing exemplary embodiments, it is to be understood that other embodiments are possible, and variations of and modifications to the embodiments shown and described may be made, without departing from the spirit and scope of the invention as defined in following claims.

What is claimed is:

1. A data storage module, comprising a data storage device shock mounted in a housing and a lock selectively engagable between the data storage device and the housing, the lock operable between a first disengaged position in which the lock does not restrict movement of the data storage device within the housing and a second engaged position in which the lock restricts substantially all movement of the data storage device within the housing.

2. The data storage module according to claim 1, wherein the lock comprises a wedge.

3. The data storage module according to claim 2, wherein the wedge is hard and the data storage device is rigidly mounted in the housing when the lock is in the second position.

4. A data storage module, comprising a data storage device wedged into a housing.

5. A data storage module, comprising:
   a housing having a top, a bottom and sides, at least one side having an opening therein;
   a data storage device;
   elastomeric members supporting the data storage device in the housing; and
   lock blocks movably connected to the data storage device, the lock blocks movable between a first disengaged position in which the blocks do not restrict movement of the data storage device within the housing and a second engaged position in which each block extends through an opening in the at least one side of the housing to restrict substantially all movement of the data storage device within the housing.

6. A data storage module according to claim 5, further comprising a camming device connecting the lock blocks and the data storage device, the camming device operative to move the blocks from the first position to the second position.

7. A data storage module according to claim 5, further comprising a camming device connecting the lock blocks and the data storage device, the camming device operative to move the blocks from the second position to the first position.

8. The data storage module according to claim 6, wherein the camming device comprises a plurality of cams connected to the data storage device for movement therewith and a plurality of cam followers connected to the lock blocks, the cam followers selectively engagable by the cams to move the blocks from the first position to the second position.

9. A data storage module according to claim 6, further comprising a spring operatively coupled between the housing and each lock block, the springs configured to bias the blocks toward the first position.

10. The data storage module according to claim 7, wherein the camming device comprises a plurality of cams connected to the data storage device for movement therewith and a plurality of cam followers connected to the lock blocks, the cam followers selectively engagable by the cams to move the blocks from the first position to the second position.

11. A data storage module according to claim 7, further comprising a spring operatively coupled between the housing and each lock block, the springs configured to bias the blocks toward the second position.

* * * * *